United States Patent
Hung et al.

(10) Patent No.: US 9,426,871 B2
(45) Date of Patent: Aug. 23, 2016

(54) WIRELESS COMMUNICATIONS CIRCUIT PROTECTION STRUCTURE

(71) Applicant: MOXA INC., New Taipei (TW)

(72) Inventors: Chung-En Hung, New Taipei (TW); Hsin-Hung Liu, New Taipei (TW)

(73) Assignee: MOXA INC., New Taipei (TW)

( * ) Notice: Subject to any disclaimer, the term of this patent is extended or adjusted under 35 U.S.C. 154(b) by 73 days.

(21) Appl. No.: 14/171,982

(22) Filed: Feb. 4, 2014

(65) Prior Publication Data

US 2015/0223311 A1    Aug. 6, 2015

(51) Int. Cl.
*H04B 3/28* (2006.01)
*H05F 3/02* (2006.01)
*H05K 1/02* (2006.01)

(52) U.S. Cl.
CPC ............. *H05F 3/02* (2013.01); *H05K 1/0227* (2013.01); *H05K 1/0231* (2013.01); *H05K 1/0259* (2013.01)

(58) Field of Classification Search
CPC ... H05K 1/162; H05K 1/0227; H05K 1/0231; H05K 1/0219; H05K 2201/093; H05K 1/0259; H01P 3/006; H05F 3/02

USPC .......................................................... 333/12
See application file for complete search history.

(56) References Cited

U.S. PATENT DOCUMENTS 7,969,261 B2 *   6/2011  Okada ........................... 333/246
8,604,891 B2 *  12/2013  Ohhira ......................... 333/24 C
9,000,866 B2 *   4/2015  Subramanyam .............. 333/157

FOREIGN PATENT DOCUMENTS

WO    WO 2009119443 A1 *  10/2009

* cited by examiner

*Primary Examiner* — Robert Pascal
*Assistant Examiner* — Kimberly Glenn
(74) *Attorney, Agent, or Firm* — Chih Feng Yeh; Huntington IP Consulting Co., Ltd.

(57) ABSTRACT

The present invention is a wireless communications circuit protection structure, in which a microstrip structure is improved and a combined structure of the microstrip structure and the coplanar waveguide (CPW) structure are improved, so that an external ground and an internal system ground may be totally separated with each other to provide electromagnetic susceptibility (EMS), electrostatic discharge (ESD), electricity leakage proofing ability, and a loss within a specific wireless communications frequency range may satisfy the wireless communications ability requirement.

8 Claims, 16 Drawing Sheets

WIRELESS COMMUNICATIONS CIRCUIT PROTECTION STRUCTURE

BACKGROUND OF THE RELATED ART

1. Technical Field

The present invention is related to a circuit protection structure, and particularly to a circuit protection structure used for wireless communications.

2. Related Art

For the currently available wireless communications circuit structures, a stripline, coupled stripline, microstrip, coupled microstrip, coplanar waveguide (CPW) and CPW ground structures are comprised.

Referring to FIG. 1A, which is a 3 dimensional view of a related art stripline structure.

The stripline structure has a base circuit board 10, which comprises a first face 11 and a second face 12 opposed to the first face 11. In the base circuit board 10, wireless communications signal lines 20. The first and second faces 11, 12 are an overall face form of grounding line 30. Thus, the characteristic resistance of the wireless communications signal lines 20 is apt to be controlled and has a relatively better shading characteristic. However, wireless communications involve a slow transmission speed.

Referring to FIG. 1B, in which a 3 dimensional view of a related art coupled stripline structure is illustrated.

The coupled stripline structure has a base circuit board 10 which comprises a first face 11 and a second face 12 opposed to the first face 11. In the base circuit board 10, wireless communications signal lines 20. The first and second faces 11, 12 are an overall face form of grounding line 30. The coupled stripline structure has its characteristic in that the characteristic resistance of the wireless communications signal line 20 may be controlled simply by controlling a thickness and a width of the two wireless communications signal lines 20, a dielectric constant of the base circuit board 10 and a distance between two layers of grounding line 20. Further, since the first face 11 and the second face 12 has the overall face form of grounding line 30, the characteristic resistance of the wireless communications signal line 20 is apt to be controlled and has a relatively better shading characteristic. However, the wireless communications involve a slower transmission speed. But, the coupled stripline structure has a larger bandwidth as compared to that of the stripline structure.

Referring to FIG. 1C, which is a 3 dimensional view of a related art microstrip structure.

The microstrip structure has a base circuit board 10, which comprises a first face 11 and a second face 12 opposed to the first face 11. In the base circuit board 10, wireless communications signal lines 20. The first and second faces 11, 12 are an overall face form of grounding line 30. The microstrip structure has its characteristic in that the characteristic resistance of the wireless communications signal line 20 may be controlled simply by controlling a thickness and a width of the wireless communications signal line 20, and a distance between the wireless communications grounding line 20 and the grounding line 30. Further, since the wireless communications signal line 20 has one of the first and second faces 11, 12 contacting with the base circuit board 10 and the other contacting with air, a larger transmission speed of wireless communications signal may be possessed, but involves a poorer shading characteristic owing to the ambient radiation interference.

Referring to FIG. 1D, in which a 3 dimensional view of a related art coupled microstrip structure is illustrated.

The coupled microstrip structure has a base circuit board 10 which comprises a first face 11 and a second face 12 opposed to the first face 11. In the base circuit board 10, wireless communications signal lines 20. The first and second faces 11, 12 are an overall face form of grounding line 30. The coupled microstrip structure has its characteristic in that the characteristic resistance of the wireless communications signal line 20 may be controlled simply by controlling a thickness and a width of the two wireless communications signal lines 20, and a distance between the two layers of grounding line 20. Further, since the wireless communications signal line 20 has one of the first and second faces 11, 12 contacting with the base circuit board 10 and the other contacting with air, a larger transmission speed of wireless communications signal may be possessed, but involves a poorer shading characteristic owing to the ambient radiation interference. However, the coupled microstrip structure has a larger bandwidth as compared to that of the stripline structure.

Referring to FIG. 1E, which is a 3 dimensional view of a related art CPW structure.

The CPW structure has a base circuit board 10, which comprises a first face 11 and a second face 12 opposed to the first face 11. In the base circuit board 10, wireless communications signal lines 20. The first and second faces 11, 12 are an overall face form of grounding line 30. The CPW structure has its characteristic in that the characteristic resistance of the wireless communications signal line 20 may be controlled simply by controlling a thickness and a width of the wireless communications signal line 20 and a distance between the wireless communications grounding line 20 and the grounding line 30. Further, since the wireless communications signal line 20 and the grounding line 30 are both disposed on the first face 11 of the base circuit board 10 in the CPW structure, the required manufacturing steps are reduced and the in-series and in-parallel forming for the wireless communications signal line 20 and the grounding line 30 and the electronic components is easy, without requiring additional through-holes on the microstrip structure, which may bring an uneglectible inductance effect and thus reduce an efficiency of high frequency wireless communications.

Referring to FIG. 1F, which is a 3 dimensional view of a related art CPW ground structure.

A wireless communications signal lines 20 is disposed on the face 11 of the base circuit board 10. A grounding line 30 is disposed on the first face 11 of the base circuit board 10 and two sides of the wireless communications signal line 20. The CPW ground structure has its characteristic in that the characteristic resistance of the wireless communications signal line 20 may be controlled simply by controlling a thickness and a width of the wireless communications signal lines 20 and a distance between the wireless communications grounding line 20 and the grounding line 30.

However, the above wireless communications circuit structure has a common characteristic of a completeness of the wireless communications signal line and grounding line. Through the completeness, a loss in the wireless communications frequency range of 800 MHz to 6 GHz is approximately 0 dB and a good wireless communications result is achieved. However, since the completeness may cause the internal system ground and external ground to be not separable, i.e. the wireless communications circuit structure cannot provide electromagnetic susceptibility (EMS), electrostatic discharge (ESD) and electricity leakage proofing ability. Correspondingly, the internal system may be interfered with EMS and affected by ESD, which may further lead to a system failure and scratch.

To provide the EMS, ESD and electricity leakage proofing ability, the wireless communications signal line and the grounding line have to be separated to each other in the wireless communications circuit structure, causing the loss in the frequency range of 800 MH to 6 GHz to be larger than 30 dB, i.e. the wireless communications result cannot be provided.

In view of the above, it is known that the currently available wireless communications circuit structure has long encountered the problems of EMS, ESD, electricity leakage proofing ability and exclusive characteristic of wireless communications functions. Therefore, it is quite a need to set forth an improved technique to settle down the associated issue.

SUMMARY

In view of the issues encountered in the currently available wireless communications circuit structure of electromagnetic susceptibility (EMS), electrostatic discharge (ESD), electricity leakage proofing ability and exclusive characteristic, the present invention discloses a wireless communications circuit protection structure.

According to a first embodiment of the present invention, the wireless communications circuit protection structure a comprises a base circuit board, a wireless communications signal line set, a first grounding line set, a second grounding line set, and a third grounding line set.

The base circuit board comprises a first face and a second face opposed thereto.

The wireless communications signal line set is disposed on the first face, and comprises a first wireless communications signal line and a second wireless communications signal line connected thereto through a capacitor in a bridging manner.

The first grounding line set is disposed on the first face and at a side of the wireless communications signal line set, having a gap with respect to the wireless communications signal line set, and comprising a first grounding line and a second grounding line connected thereto through a capacitor in a bridging manner.

The second grounding line set is disposed on the first face and at the other side of the wireless communications signal line set, having a gap with respect to the wireless communications signal line set, and comprising a third grounding line and a fourth grounding line connected thereto through a capacitor in a bridging manner.

The third grounding line set is disposed on the second face and comprising a fifth grounding line and a sixth grounding line connected thereto through a capacitor in a bridging manner.

According to a second embodiment of the present invention, the wireless communications circuit protection structure comprises a base circuit board, a wireless communications signal line set and a third grounding line set.

The base circuit board comprises a first face and a second face opposed thereto.

The wireless communications signal line set is disposed on the first face, and comprises a first wireless communications signal line and a second wireless communications signal line connected thereto through a capacitor in a bridging manner.

The third grounding line set is disposed on the second face and comprises a fifth grounding line and a sixth grounding line connected thereto through a capacitor in a bridging manner.

The structure of the present invention has the differences as compared to the related art that a microstrip structure is improved and the microstrip structure and a coplanar waveguide structure are combined and improved, so that an external ground and an internal system ground may be totally separated with each other to provide electromagnetic susceptibility (EMS), electrostatic discharge (ESD), electricity leakage proofing ability, and a loss within a specific wireless communications frequency range may satisfy the wireless communications ability requirement.

Through the above technical means, the present invention may provide electromagnetic susceptibility (EMS), electrostatic discharge (ESD), and electricity leakage proofing ability, and the wireless communications ability requirement.

BRIEF DESCRIPTION OF THE DRAWINGS

The present invention will become more fully understood from the detailed description given herein below illustration only, and thus is not limitative of the present invention, and wherein.

DETAILED DESCRIPTION

The present invention will be apparent from the following detailed description, which proceeds with reference to the accompanying drawings, wherein the same references relate to the same elements. With reference to the detailed description, those skilled in the art may use the technical skill to solve the associated problem and thus achieve in the technical efficacy associated therewith, namely, may be enabled to implement the present invention.

Figure 1A:
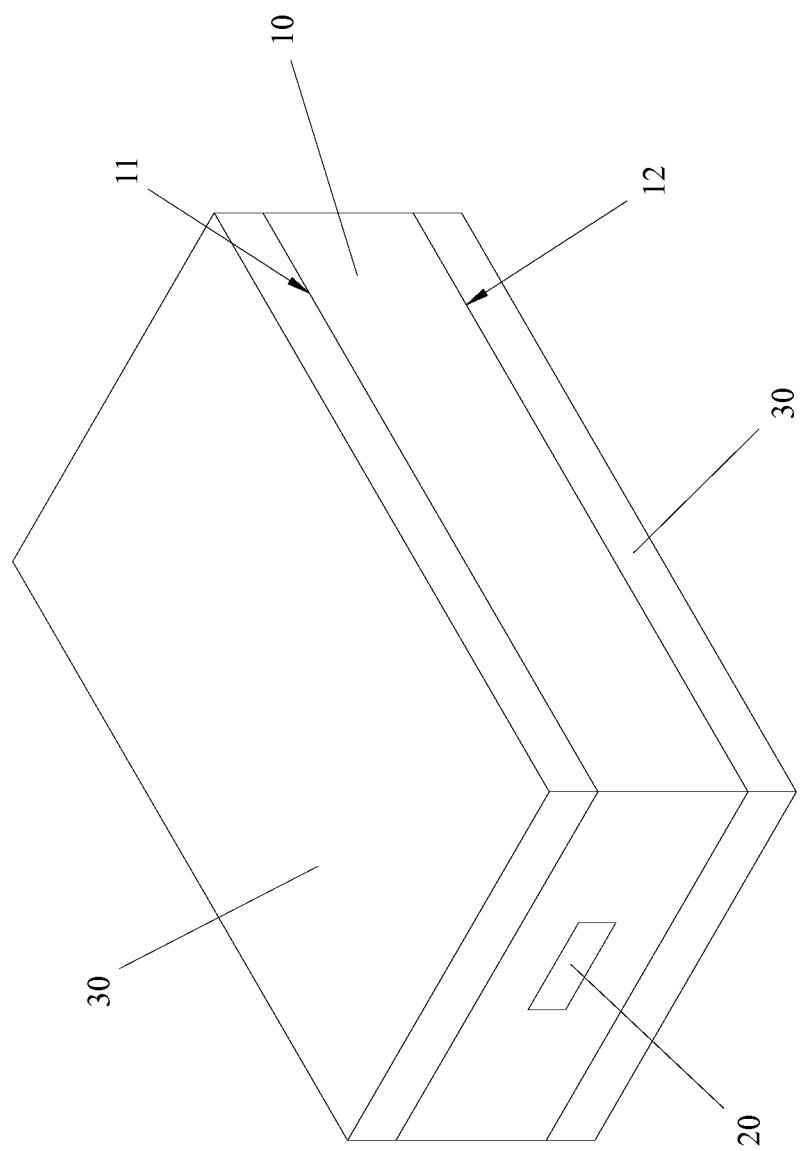
FIG. 1A is a 3 dimensional diagram of a related art stripline structure.
Figure 1B:
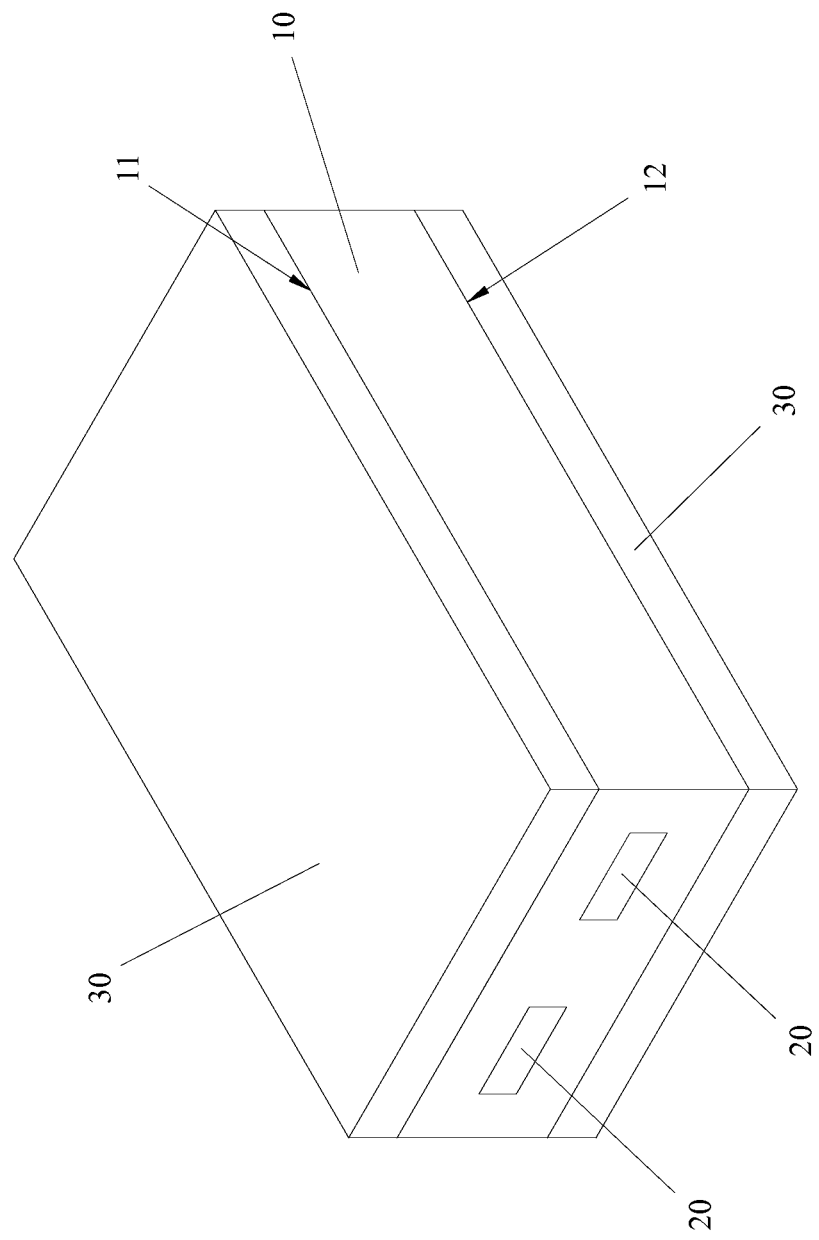
FIG. 1B is a 3 dimensional diagram of a related art coupled stripline structure.
Figure 1C:
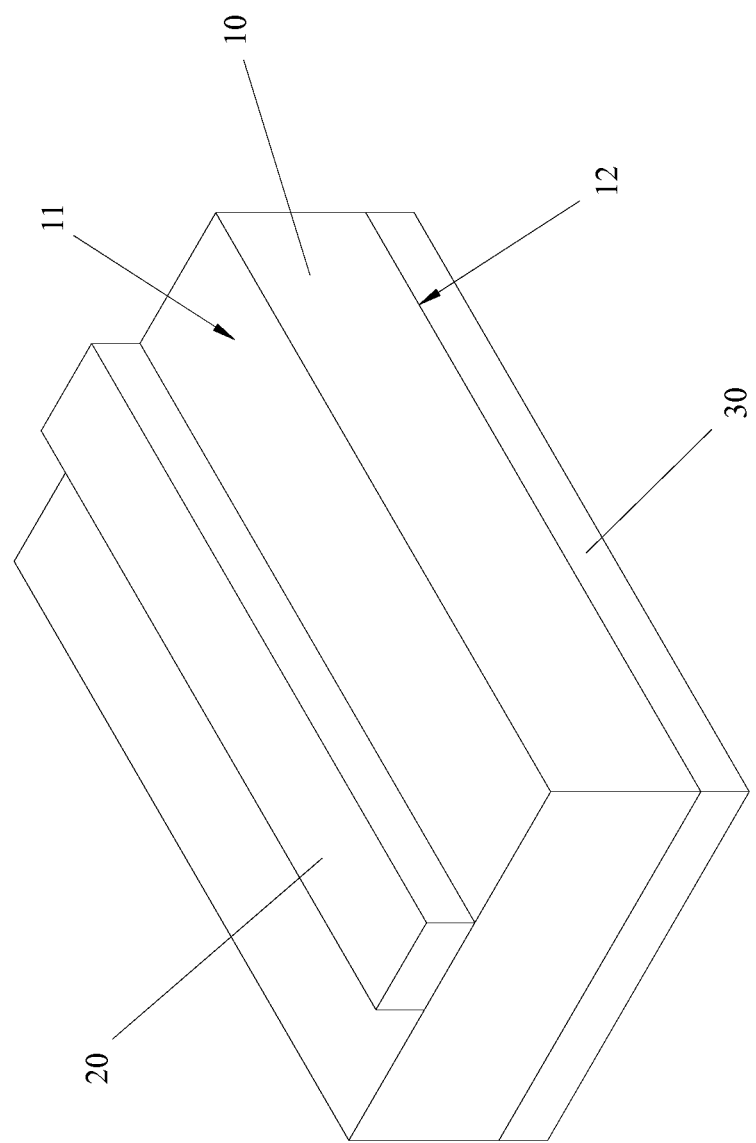
FIG. 1C is a 3 dimensional diagram of a related art microstrip structure.
Figure 1D:
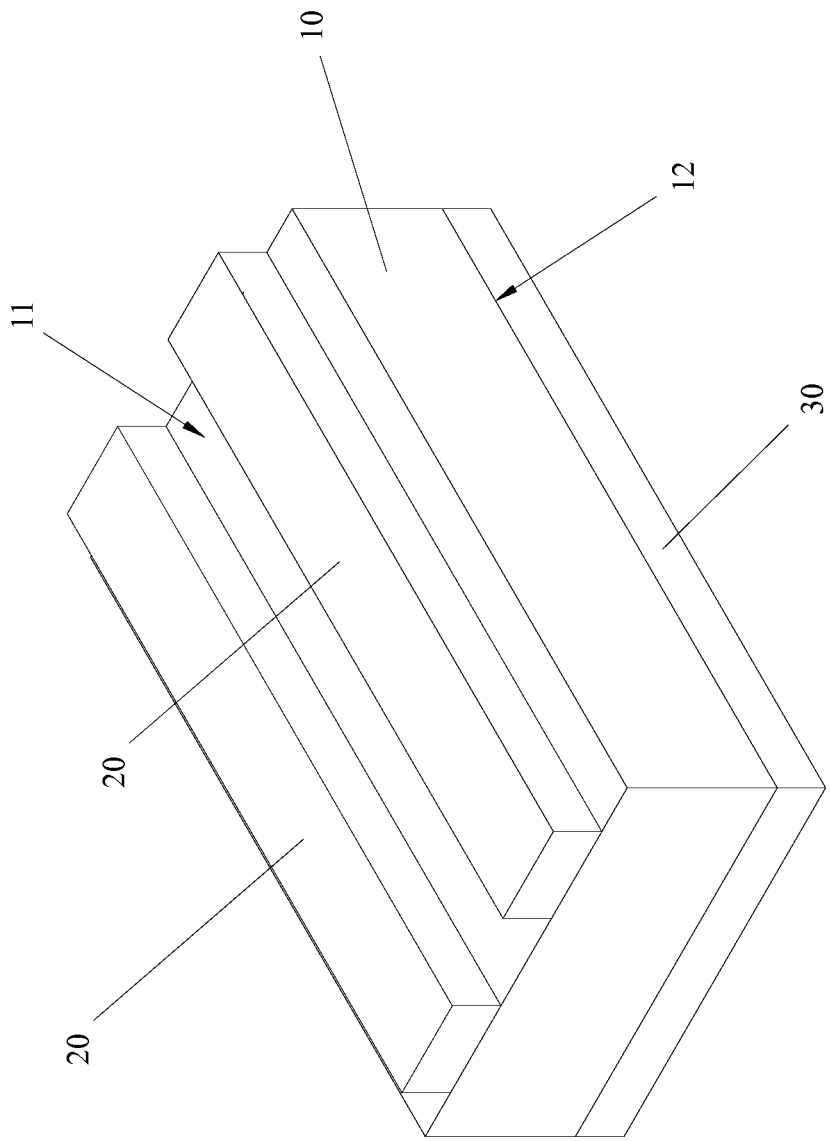
FIG. 1D is a 3 dimensional diagram of a related art coupled microstrip structure.
Figure 1E:
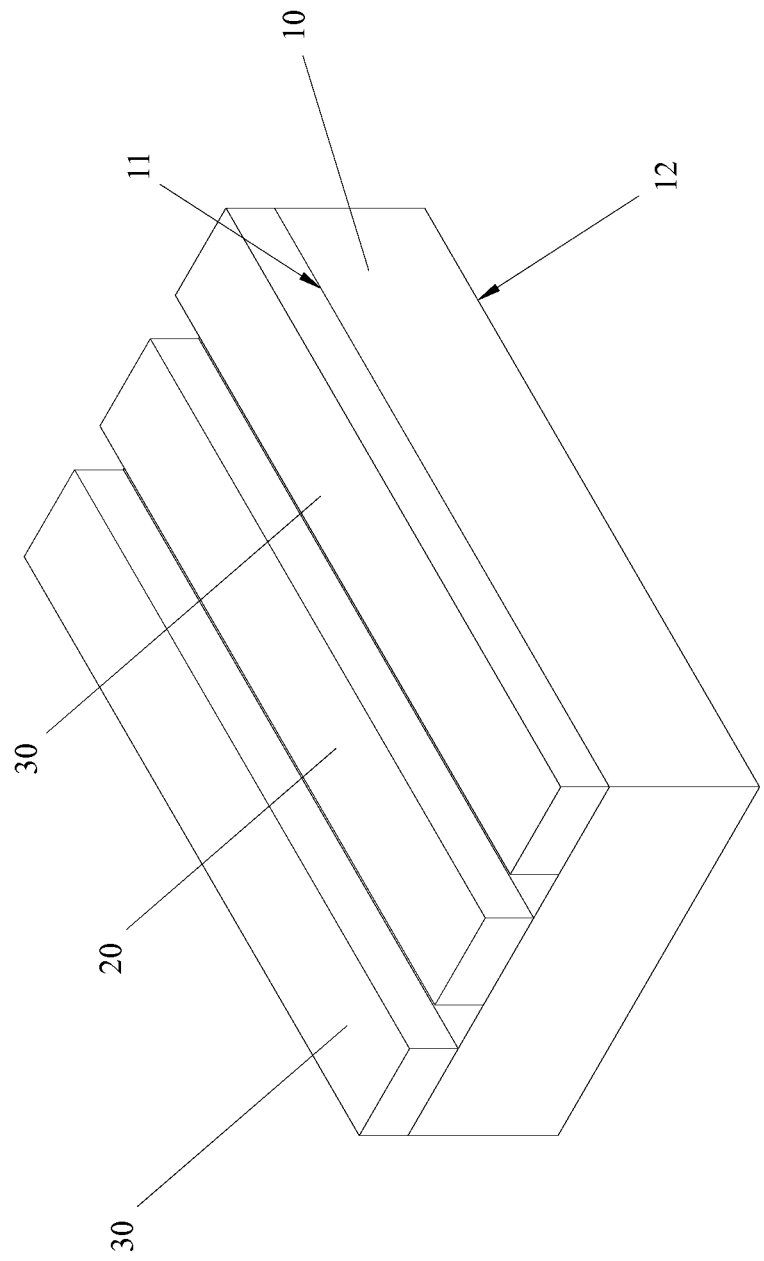
FIG. 1E is a 3 dimensional diagram of a related art coplanar waveguide (CPW) structure.
Figure 1F:
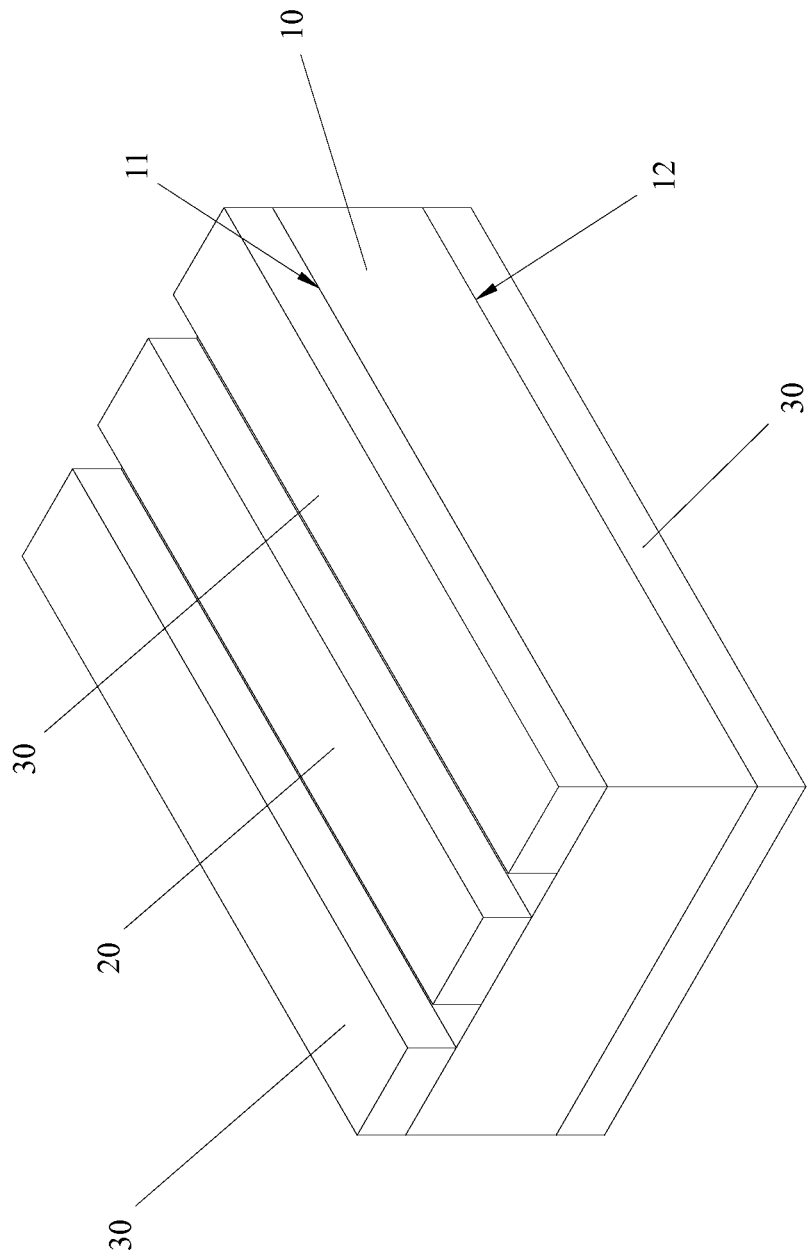
FIG. 1F is a 3 dimensional diagram of a related art CPW ground structure.
Figure 2A:
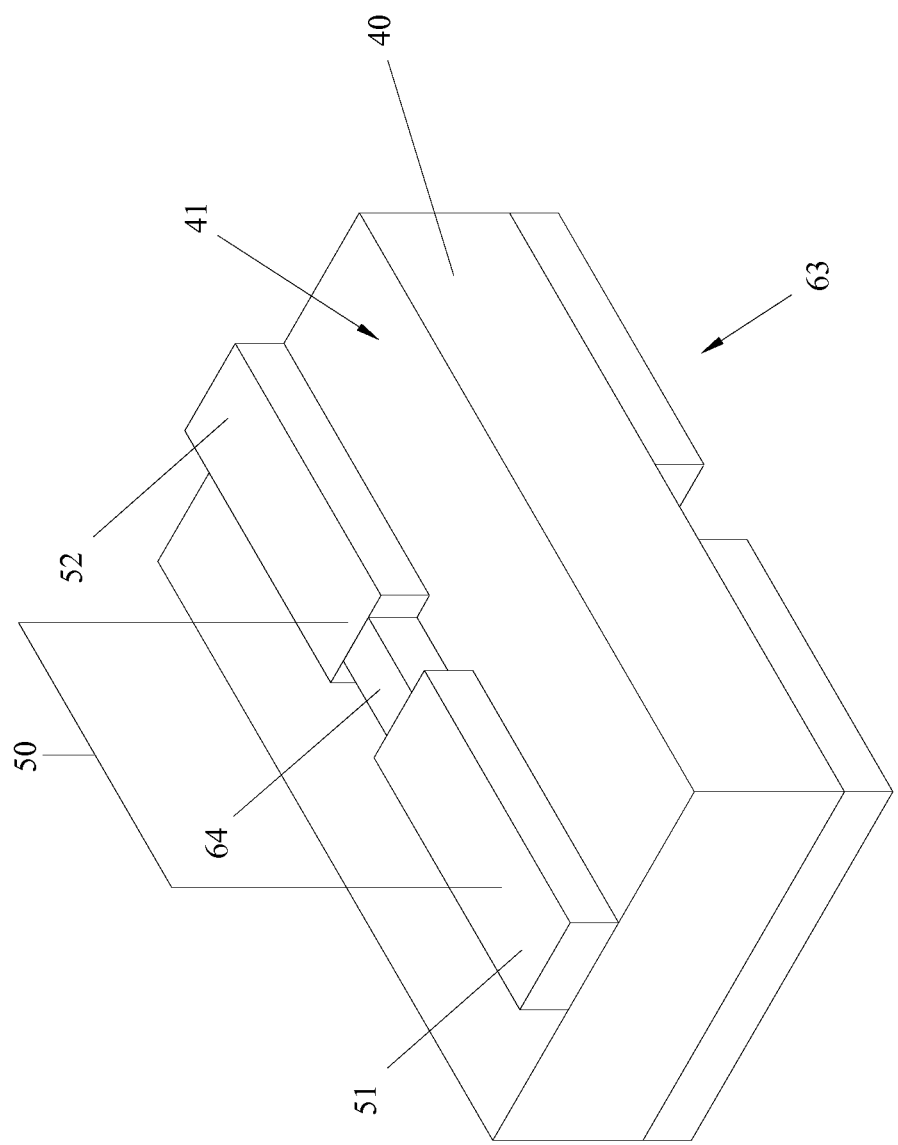
FIG. 2A is a 3 dimensional diagram of a wireless communications circuit protection structure according to a first embodiment of the present invention.
Figure 2B:
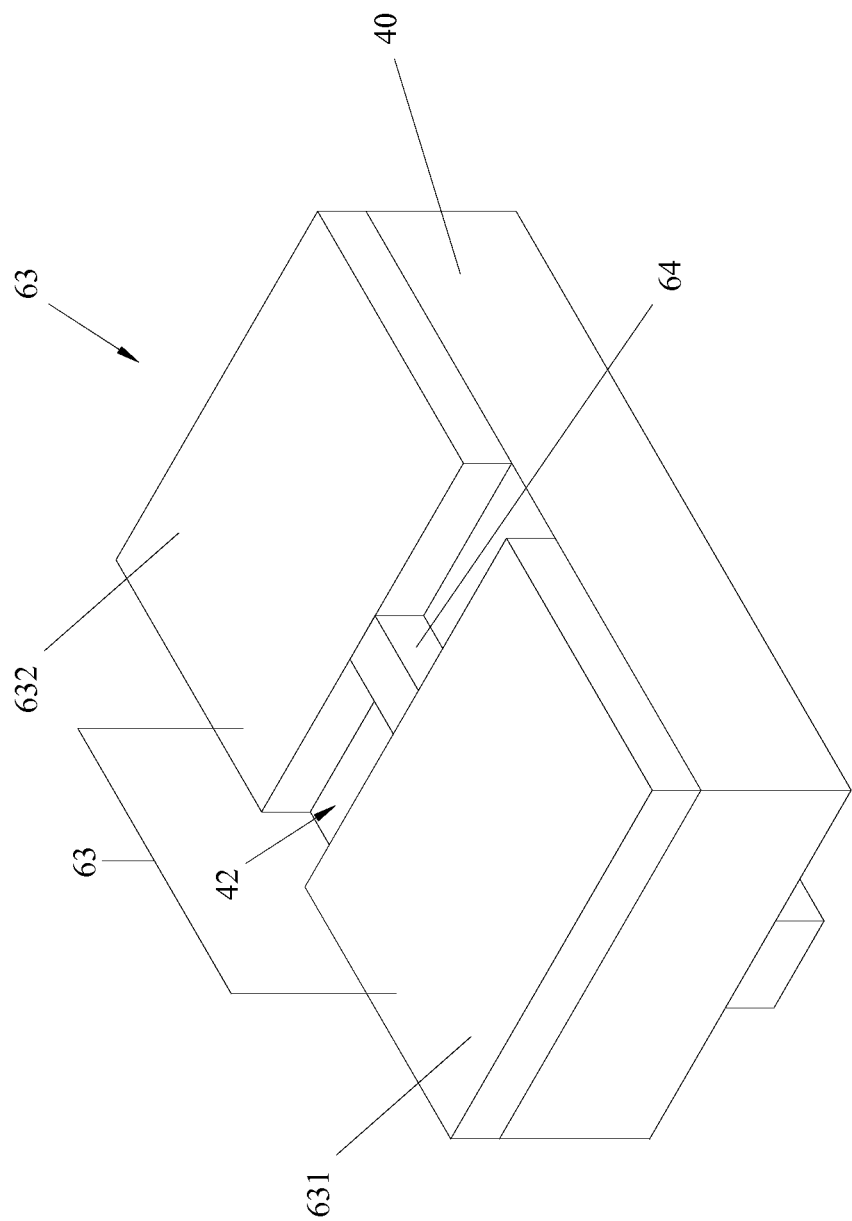
FIG. 2B is a 3 dimensional diagram of the wireless communications circuit protection structure according to a second embodiment of the present invention.
Figure 2C:
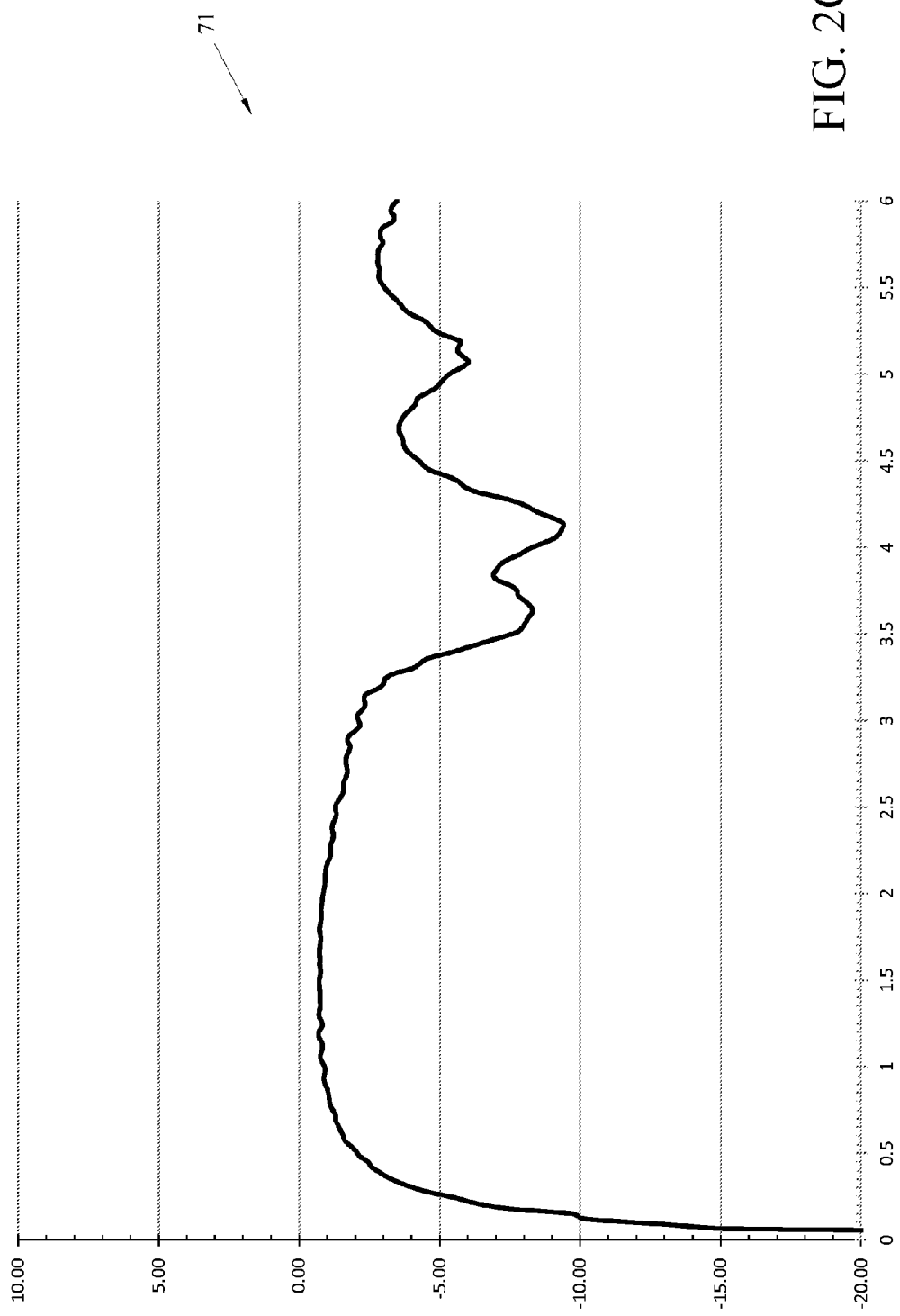
FIG. 2C is a data diagram of the wireless communications circuit protection structure according to the first embodiment of the present invention.

In the following, a first embodiment of a wireless communications circuit protection structure according to the present invention will be first described, with reference to FIG. 2A to FIG. 2C, wherein FIG. 2A is a 3 dimensional diagram of a wireless communications circuit protection structure according to a first embodiment of the present invention; FIG. 2B is a 3 dimensional diagram of the wireless communications circuit protection structure according to a second embodiment of the present invention; and FIG. 2C is a data diagram of the wireless communications circuit protection structure according to the first embodiment of the present invention.

At first, a microstrip structure is used to improve. The improved microstrip structure has a base circuit board 40. The base circuit board 40 comprises a first face 41 and a second face 42 opposed thereto. The wireless communications signal line set 50 is disposed on the first face 41, and comprises a first wireless communications signal line 51 and a second wireless communications signal line 52. The first wireless communications signal line 51 is connected to a second wireless communications signal line 52 in a bridging manner.

A third grounding line set 63 is disposed on the second face 42 and comprises a fifth grounding line 631 and a sixth grounding line 632. Between the fifth grounding line 631 and the sixth grounding line 632, there is a gap, by which the third grounding line set 63 and the fifth grounding line 631 are defined as being externally grounded. Further, the third grounding line set 63 and the sixth grounding line 632 are defined as being systematically grounded. As such, the internal system ground and the external ground are totally separated with each other.

From the related art, it may be taught that the first and second wireless communications signal lines 51, 52 and the fifth and sixth grounding lines 631, 632 are separated to each other, respectively, so that EMS, ESD and electricity leakage proofing ability may be provided. However, a loss at a frequency range of 800 MHz to 6 GHz for wireless communications at this time is still larger than 30 dB, which is incapable of providing the wireless communications result.

Therefore, it is required to connect the fifth grounding line 631 through a capacitor 64 in a bridging manner, with which the EMS, ESD, and electricity leakage proofing ability may be simultaneously provided. Furthermore, it may be known according to the experimental data as shown in FIG. 2C, that the loss at the wireless communications frequency of 800 MHz is smaller than 0.5 dB, the loss at the wireless communications frequency of 2.4 GHz is smaller than 1.3 dB, the loss at the wireless communications frequency of 5 GHz is larger than 8 dB and the loss at the wireless communications frequency of 5.9 GHz is larger than 15 dB.

In view of the above, the improved microstrip structure may provide a good wireless communications result and have the EMS, ESD and electricity leakage proofing ability. However, for the frequency range of beyond 2.4 GHz, the wireless communications result reduces significantly.

Figure 3A:
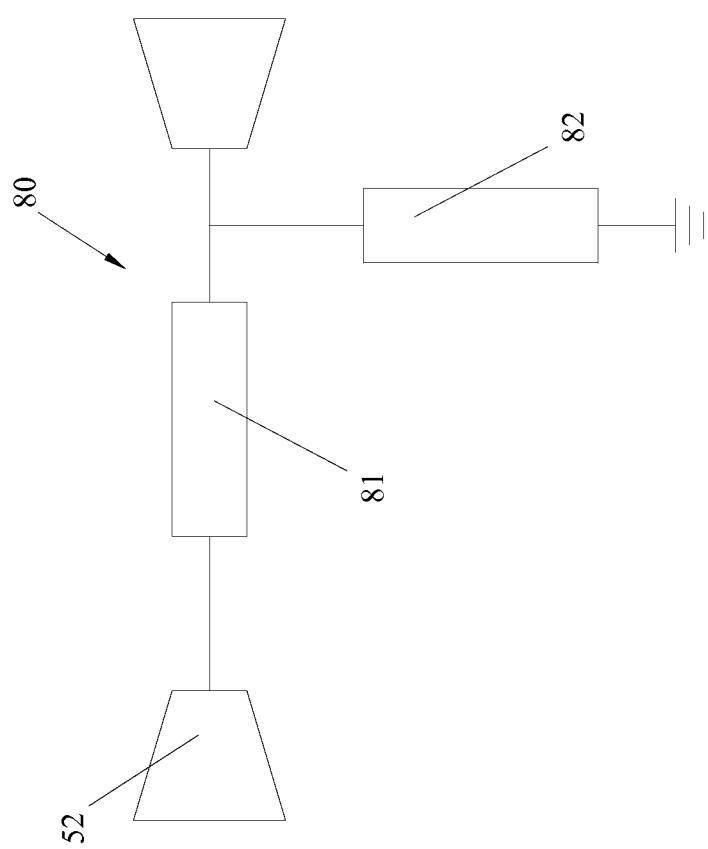
FIG. 3A and FIG. 3B are a diagram of a circuit connected in series by the wireless communications circuit protection structure of the present invention and an EMS component set, respectively.
Figure 3B:
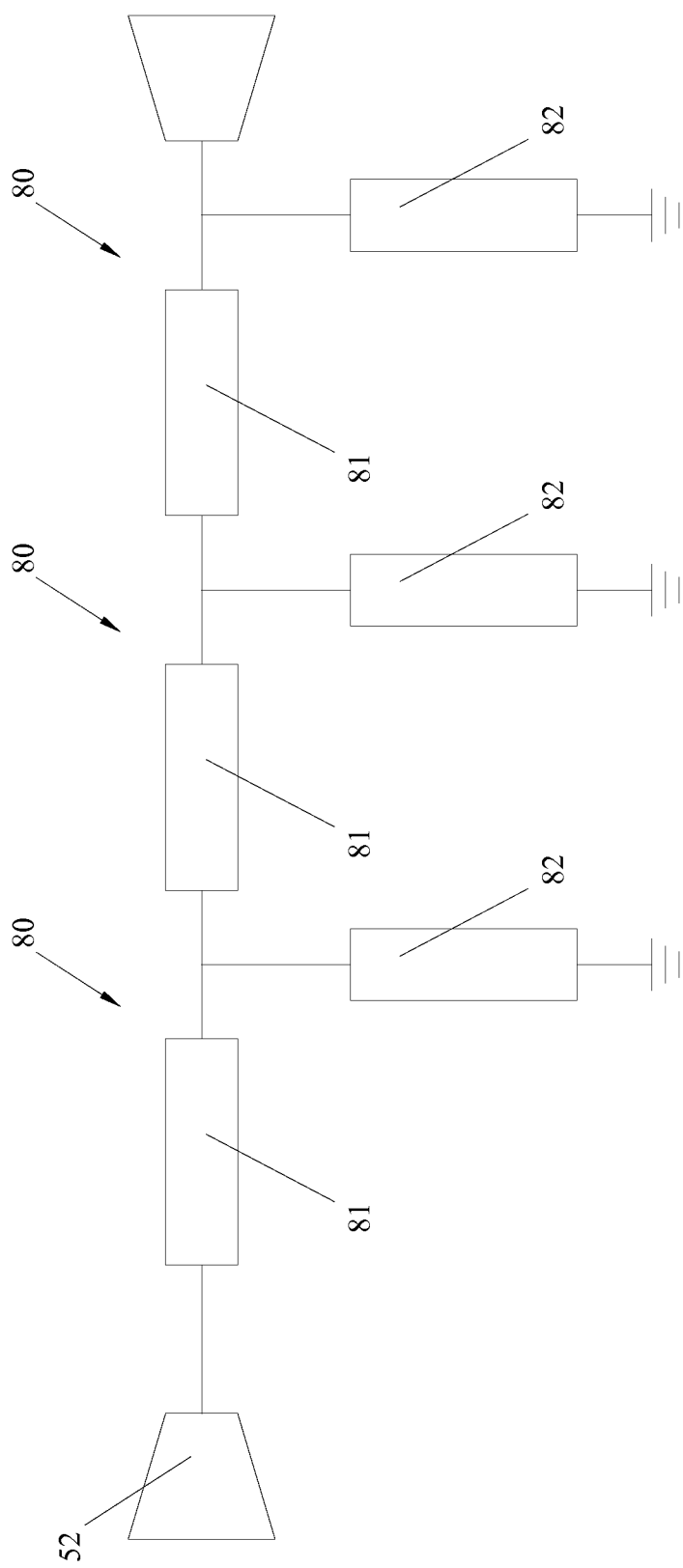

Referring to FIG. 3A and FIG. 3B, in which a diagram of a circuit connected in series by the wireless communications circuit protection structure of the present invention and an EMS component set is respectively shown.

To further provide the EMS of the wireless communications circuit protection structure of the present invention, the second wireless communications signal line 52 of the wireless communications signal line set 50 may be connected in series with an EMS component set 80, which comprises a capacitor 81 and an inductance 82, in which the capacitor 81 is connected to a system ground through the inductance 82.

As shown in FIG. 3A, the second wireless communications signal line 52 is connected in series to an EMS component set 80. As shown in FIG. 3B, the second wireless communications signal line 52 of the wireless communications signal set 50 is connected in series with the three EMS component sets 80. however, this is merely an example, without limiting the present invention.

The more the EMS component sets 80 are connected with the second wireless communications signal line 52 of the wireless communications signal line set 50, higher the resulting EMS is presented.

Figure 4A:
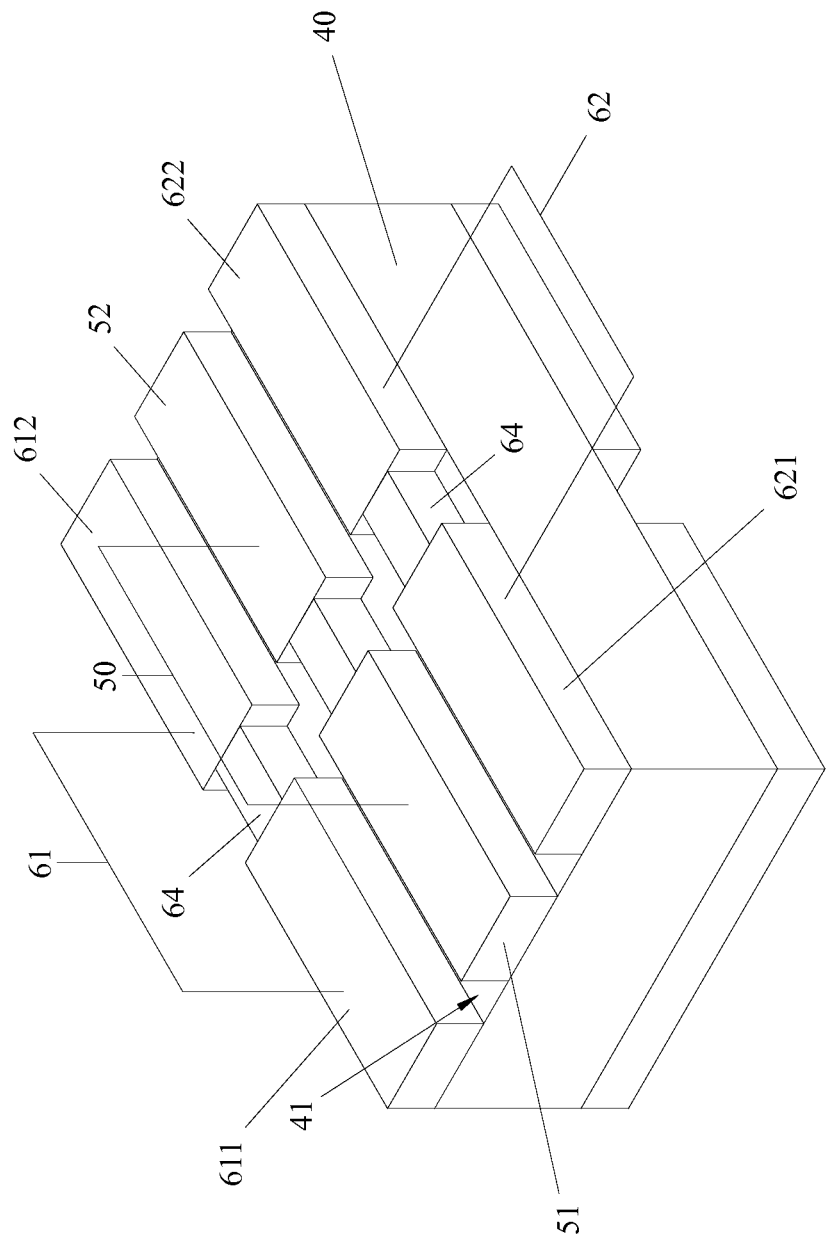
FIG. 4A is a 3 dimensional diagram from a first viewing angle of the wireless communications circuit protection structure according to the second embodiment of the present invention.
Figure 4B:
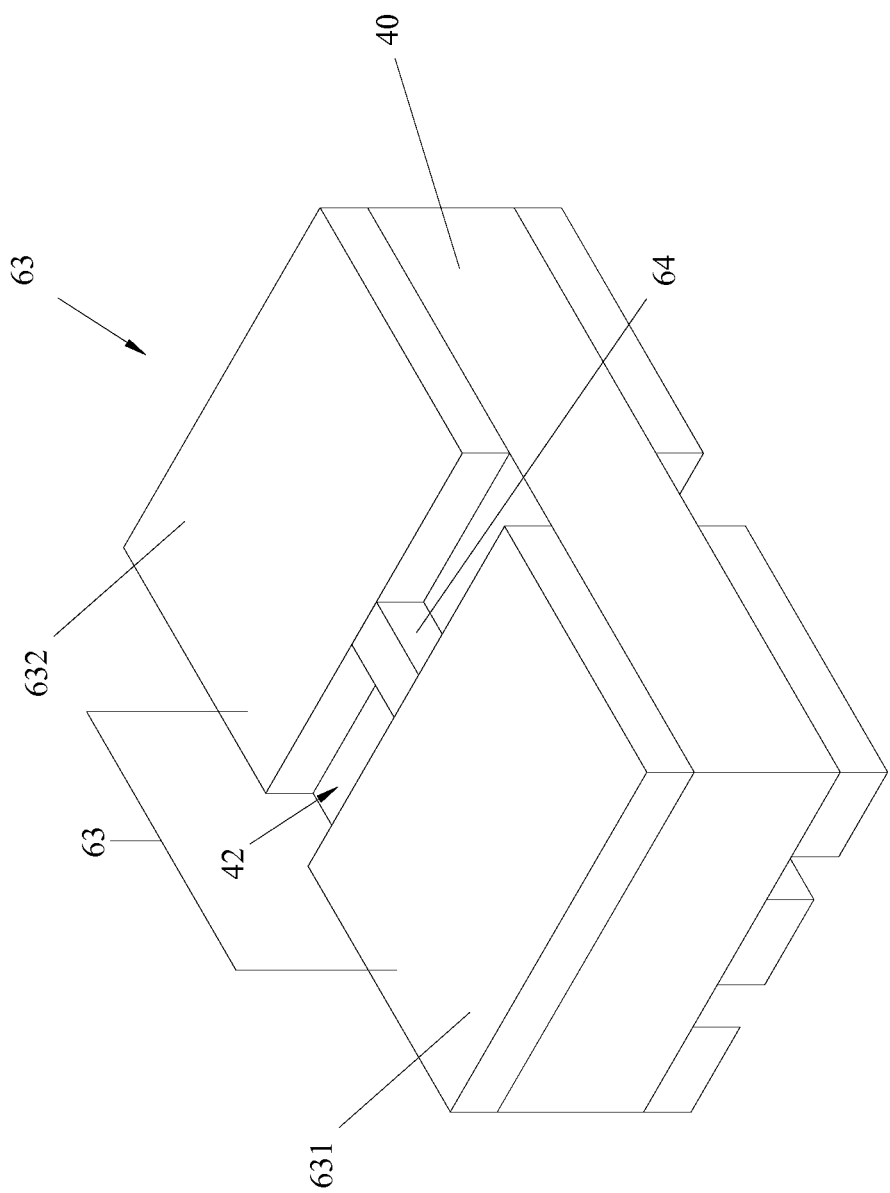
FIG. 4B is a 3 dimensional diagram from a second viewing angle of the wireless communications circuit protection structure according to the second embodiment of the present invention.
Figure 4C:
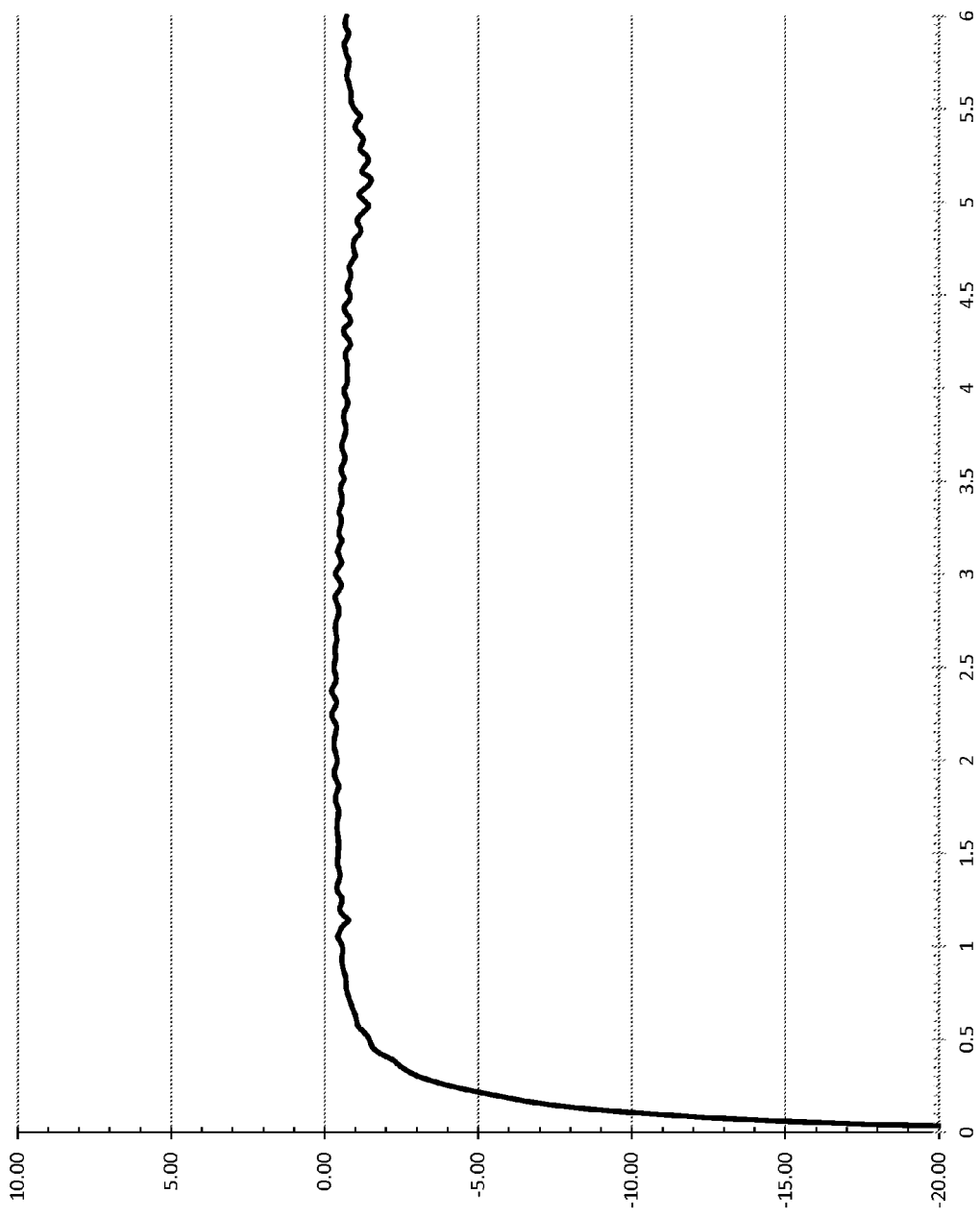
FIG. 4C a data diagram of the wireless communications circuit protection structure according to the second embodiment of the present invention.

Thereafter, the wireless communications circuit protection structure according to a second embodiments of the present invention is described with reference to FIG. 4A to FIG. 4C. FIG. 4A is a 3 dimensional diagram from a first viewing angle of the wireless communications circuit protection structure according to the second embodiment of the present invention. FIG. 4B is a 3 dimensional diagram from a second viewing angle of the wireless communications circuit protection structure according to the second embodiment of the present invention. FIG. 4C a data diagram of the wireless communications circuit protection structure according to the second embodiment of the present invention.

The second embodiment is improved from the first embodiment. To further reduce the loss in the frequency range of beyond 2.4 GHz, the improved combination of the microstrip structure and CPW structure is further improved.

The improved combination of the microstrip structure and CPW structure is further improved to form the wireless communications circuit protection structure. In this structure, a base circuit board 40 comprises a first face 41 and a second face 42 opposed thereto. The wireless communications signal line set 50 is disposed on the first face 41. The wireless communications signal line set 50 comprises a first wireless communications signal line 51 and a second wireless communications signal line 52, which is connected to the first wireless communications signal line 51 through a capacitor 64 in a bridging manner.

The third grounding line set 63 is disposed on the second face 42, and comprises a fifth grounding line 631 and a sixth grounding line 632, which is connected to the sixth grounding line 632 through a capacitor 64 in a bridging manner.

A first grounding line set 61 is disposed at a side of the wireless communications line set 50 and on the first face 41. A gap exists between the first grounding line set 61 and the wireless communications signal line set 50. And, the first grounding line 611 is connected to the second grounding line 612 through a capacitor 64 in a bridging manner.

A second grounding line set 42 is disposed at the other side of the wireless communications line set 50 and on the first face 41. A gap exists between the second grounding line set 42 and the wireless communications signal line set 50. And, the third grounding line 621 is connected to the fourth grounding line 612 through a capacitor 64 in a bridging manner.

The first grounding line 611 of the first grounding line set 61, the third grounding line 621 of the second grounding line set 42 and the fifth grounding line 631 of the third grounding line set 63 are defined as being externally grounded, while the second grounding line 612 of the first grounding line set 61, the fourth grounding line 622 of the second grounding line set 42 and the sixth grounding line 632 of the sixth grounding line set 63 are defined as being systematically grounded.

In the wireless communications circuit protection structure of the present invention, the internal system ground and the external ground are totally separated with each other, so as to provide EMS, ESD and electricity leakage proofing ability. After some tests, it is found that the wireless communications circuit protection structure may satisfy a contact discharging test of 8 KV of ESD.

It may be known after the tests that the losses of the wireless communications at 800 MHz to 6 GHz are all smaller than 1 dB. Therefore, the circuit protection structure of the present invention provides a good wireless communications result and have EMS, ESD, and electricity leakage proofing ability.

Figure 5A:
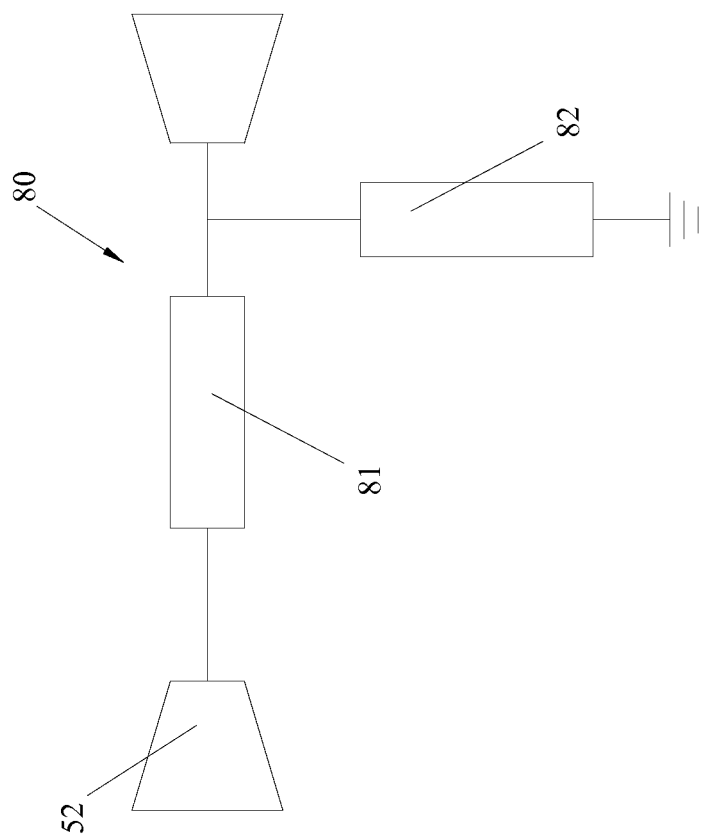
FIG. 5A and FIG. 5B are a diagram of a circuit connected in series by the wireless communications circuit protection structure of the present invention and an EMS component set, respectively.
Figure 5B:
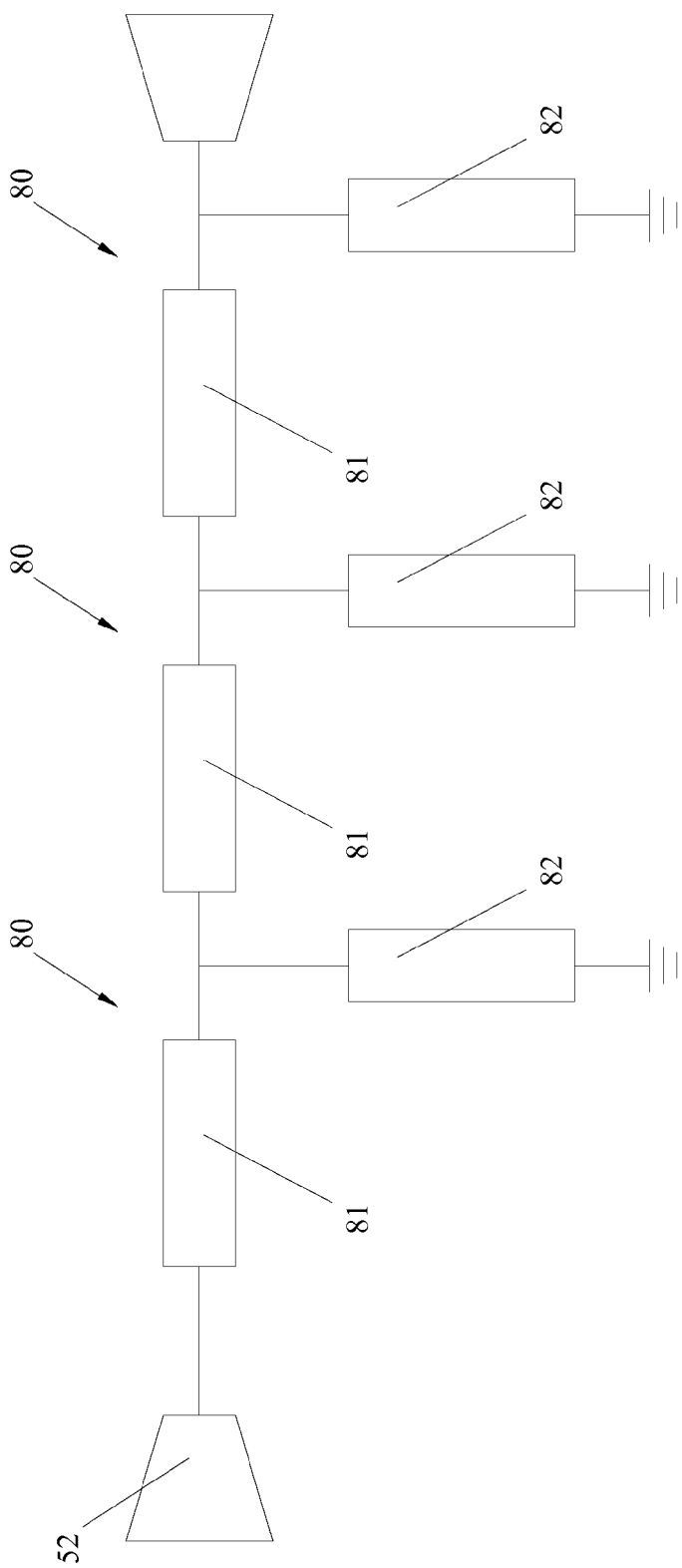

Referring next to FIG. 5A and FIG. 5B, which are a diagram of a circuit connected in series by the wireless communications circuit protection structure of the present invention and an EMS component set, respectively.

To further promote the EMS of the wireless communications circuit protection structure, the second wireless communications signal line 52 of the wireless communications signal line set 50 may be connected in series with the EMS component set 80, which comprises a capacitor 81 and an inductor 82, the capacitor being connected to the system ground through the inductor 82.

As shown in FIG. 5A, the second wireless communications signal line 52 of the wireless communications signal line set 50 is connected in series with the single EMS component set 80. As shown in FIG. 5B, the second wireless communications signal line 52 of the wireless communications signal line set 50 is connected in series with three EMS component sets 80. However, these are merely examples, without limiting the present invention.

The more sets of the EMS component 80 the second wireless communications signal line 52 of the wireless communications signal line set 50 are connected to, the higher the resulting EMS is.

In view of the above, it may be known that he structure of the present invention has the differences as compared to the related art that a microstrip structure is improved and the microstrip structure and a coplanar waveguide structure are combined and improved, so that an external ground and an internal system ground may be totally separated with each other to provide electromagnetic susceptibility (EMS), electrostatic discharge (ESD), electricity leakage proofing ability, and a loss within a specific wireless communications frequency range may satisfy the wireless communications ability requirement.

Through the above technical means, the present invention may overcome the issues encountered in the related art of EMS, ESD, electricity leakage proofing ability, and exclusive characteristic of the wireless communications functions. Furthermore, the EMS, ESD, electricity leakage proofing ability, and the wireless communications functions may be well provided.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A wireless communications circuit protection structure, comprising:
   a base circuit board, comprising a first face and a second face opposed thereto;
   a wireless communications signal line set, disposed on the first face, and comprising a first wireless communications signal line and a second wireless communications signal line connected thereto through a capacitor in a bridging manner;
   a first grounding line set, disposed on the first face and at a side of the wireless communications signal line set, having a gap with respect to the wireless communications signal line set, and comprising a first grounding line and a second grounding line connected thereto through a capacitor in a bridging manner;
   a second grounding line set, disposed on the first face and at the other side of the wireless communications signal line set, having a gap with respect to the wireless communications signal line set, and comprising a third grounding line and a fourth grounding line connected thereto through a capacitor in a bridging manner; and
   a third grounding line set, disposed on the second face and comprising a fifth grounding line and a sixth grounding line connected thereto through a capacitor in a bridging manner;
   wherein the first grounding line, the third grounding line and the fifth grounding line are defined as being externally grounded, and the second grounding line, the fourth grounding line and the sixth grounding line are defined as being systematically grounded.

2. The wireless communications circuit protection structure as claimed in claim 1, having a loss smaller than 1 dB in a frequency range between 800 MHz and 6 GHz.

3. The wireless communications circuit protection structure as claimed in claim 1, wherein the second wireless communications signal line is further connected to at least an electromagnetic susceptibility (EMS) component set in series, the EMS component set comprising the capacitor and an inductance, the capacitor being connected to a system ground through the inductance.

4. The wireless communications circuit protection structure as claimed in claim 1, wherein a contact discharging test for 8 KV of electrostatic discharge (ESD) is satisfied.

5. The wireless communications circuit protection structure as claimed in claim 1, wherein a contact discharging test for 8 KV of electrostatic discharge (ESD) is satisfied.

6. A wireless communications circuit protection structure, comprising:
   a base circuit board, comprising a first face and a second face opposed thereto;
   a wireless communications signal line set, disposed on the first face, and comprising a first wireless communications signal line and a second wireless communications signal line connected thereto through a capacitor in a bridging manner; and
   a third grounding line set, disposed on the second face and comprising a fifth grounding line and a sixth grounding line connected thereto through a capacitor in a bridging manner;
   wherein the fifth grounding line are defined as being externally grounded, respectively, and the sixth grounding line are defined as being systematically grounded, respectively.

7. The wireless communications circuit protection structure as claimed in claim 6, having a loss smaller than 1.2 dB in a frequency range between 800 MHz and 2.4 GHz.

8. The wireless communications circuit protection structure as claimed in claim 6, wherein the second wireless communications signal line is further connected to at least an electromagnetic susceptibility (EMS) component set in series, the EMS component set comprising the capacitor and an inductance, the capacitor being connected to a system ground through the inductance.

* * * * *